(12) United States Patent
Duran et al.

(10) Patent No.: US 11,251,116 B2
(45) Date of Patent: Feb. 15, 2022

(54) POWER SEMICONDUCTOR MODULE FOR IMPROVED HEAT DISSIPATION AND POWER DENSITY, AND METHOD FOR MANUFACTURING THE SAME

(71) Applicant: HUAWEI TECHNOLOGIES CO., LTD., Guangdong (CN)

(72) Inventors: Hamit Duran, Munich (DE); Junfu Hu, Dongguan (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 0 days.

(21) Appl. No.: 16/799,399

(22) Filed: Feb. 24, 2020

(65) Prior Publication Data
US 2020/0194364 A1    Jun. 18, 2020

Related U.S. Application Data

(63) Continuation of application No. PCT/EP2017/071429, filed on Aug. 25, 2017.

(51) Int. Cl.
| | |
|---|---|
| *H01L 23/498* | (2006.01) |
| *H01L 21/48* | (2006.01) |
| *H01L 23/31* | (2006.01) |
| *H01L 23/433* | (2006.01) |
| *H01L 23/538* | (2006.01) |

(Continued)

(52) U.S. Cl.
CPC .... *H01L 23/49861* (2013.01); *H01L 21/4853* (2013.01); *H01L 23/3107* (2013.01); *H01L 23/4334* (2013.01); *H01L 23/49833* (2013.01); *H01L 23/5385* (2013.01); *H01L 24/48* (2013.01); *H01L 25/071* (2013.01);
(Continued)

(58) Field of Classification Search
CPC .......... H01L 23/49861; H01L 21/4853; H01L 23/3107; H01L 23/4334; H01L 23/49833; H01L 23/5385; H01L 25/071; H01L 25/074; H01L 25/18; H01L 25/50
See application file for complete search history.

(56) References Cited

U.S. PATENT DOCUMENTS

| | | | |
|---|---|---|---|
| 3,783,347 A | 1/1974 | Vladik | |
| 5,332,921 A | 7/1994 | Dousen et al. | |

(Continued)

FOREIGN PATENT DOCUMENTS

| | | |
|---|---|---|
| CN | 102024770 A | 4/2011 |
| CN | 105655310 A | 6/2016 |

(Continued)

*Primary Examiner* — Quoc D Hoang
(74) *Attorney, Agent, or Firm* — Womble Bond Dickinson (US) LLP

(57) ABSTRACT

The present disclosure relates to a semiconductor module, especially a power semiconductor module, in which the heat dissipation is improved and the power density is increased. The semiconductor module may include at least two electrically insulating substrates, each having a first main surface and a second main surface opposite to the first main surface. On the first main surface of each of the substrates, at least one semiconductor device is mounted. An external terminal is connected to the first main surface of at least one of the substrates. The substrates are arranged opposite to each other so that their first main surfaces are facing each other.

12 Claims, 6 Drawing Sheets

(51) Int. Cl.
*H01L 23/00* (2006.01)
*H01L 25/07* (2006.01)
*H01L 25/18* (2006.01)
*H01L 25/00* (2006.01)

(52) U.S. Cl.
CPC ............ *H01L 25/074* (2013.01); *H01L 25/18* (2013.01); *H01L 25/50* (2013.01); *H01L 2224/48225* (2013.01)

(56) References Cited

U.S. PATENT DOCUMENTS

| | | | |
|---|---|---|---|
| 5,798,564 | A | 8/1998 | Eng et al. |
| 6,265,769 | B1 | 7/2001 | Liang et al. |
| 6,603,197 | B1 | 8/2003 | Yoshida et al. |
| 9,431,318 | B2 | 8/2016 | Morino |
| 2007/0099437 | A1 | 5/2007 | Hable |
| 2008/0122075 | A1 | 5/2008 | Bauer et al. |
| 2013/0009290 | A1 | 1/2013 | Lim et al. |
| 2015/0179611 | A1* | 6/2015 | Lu .................. H01L 23/5389 257/659 |
| 2015/0187684 | A1 | 7/2015 | Myung et al. |
| 2016/0005675 | A1 | 1/2016 | Tong |
| 2016/0064308 | A1 | 3/2016 | Yamada |
| 2016/0358837 | A1 | 12/2016 | Liang et al. |
| 2016/0381785 | A1 | 12/2016 | Lu et al. |
| 2017/0047274 | A1 | 2/2017 | Shibuya |
| 2017/0110341 | A1 | 4/2017 | Onoda et al. |
| 2017/0317006 | A1 | 11/2017 | Okumura |
| 2018/0308789 | A1 | 10/2018 | Zhao et al. |

FOREIGN PATENT DOCUMENTS

| | | |
|---|---|---|
| CN | 106206417 A | 12/2016 |
| DE | 102013200652 A1 | 7/2014 |
| JP | 2008166333 A | 7/2008 |
| JP | 2008186890 A | 8/2008 |
| JP | 2008210829 A | 9/2008 |
| JP | 2010062491 A | 3/2010 |
| JP | 2014072423 A | 4/2014 |
| JP | 2015185833 A | 10/2015 |
| JP | 2016100479 A | 5/2016 |
| WO | 2010081465 A2 | 7/2010 |

* cited by examiner

POWER SEMICONDUCTOR MODULE FOR IMPROVED HEAT DISSIPATION AND POWER DENSITY, AND METHOD FOR MANUFACTURING THE SAME

CROSS-REFERENCE TO RELATED APPLICATIONS

This application is a continuation of International Application No. PCT/EP2017/071429, filed on Aug. 25, 2017, the disclosure of which is hereby incorporated by reference in its entirety.

FIELD OF THE DISCLOSURE

The present disclosure relates to a semiconductor module, especially a power semiconductor module.

BACKGROUND

One of the key issues of power modules is the heat removal from the semiconductor devices comprised therein such as insulated-gate bipolar transistors (IGBTs), metal-oxide-semiconductor field-effect transistors (MOSFETs), diodes etc. Usually, the top side of the semiconductor devices is used to make the electrical connection to the connection pads of the device whereas the bottom side is used to remove the heat by attaching it to a thermally conductive, but electrically isolating material like a ceramic substrate. In a classical setup, a power module has a cooling plate on the bottom side, and the electrical contacts on the top side.

To further reduce the thermal resistance of the module, the top side of the semiconductor device may also be used to remove heat by attaching a thermally conductive material, e.g. a copper block. An example for such a module is described in JP 2008/186890 A. In an embodiment thereof, two semiconductor devices are held between two heat dissipation plates whose inner faces face each other, and they are encapsulated by a mold resin in a manner that the heat dissipation plates and the semiconductor devices are enclosed. The outer faces of the heat dissipation plates are exposed from the mold resin. The semiconductor elements are mounted on one of the heat dissipation plates and connected via a spacer to the other heat dissipation plate.

Such a module is also described in Andreas Grassmann, Ottmar Geitner, Wolfram Hable, Christian Neugirg, Alexander Schwarz, Frank Winter, Inpil Yoo: "Double Sided Cooled Module concept for High Power Density in HEV Applications", PCIM Europe 2015, 19-21 May 2015, Nuremberg, Germany, pages 442 to 448. The power module combines double sided chip cooling with electrical isolation of the heat sinks. Electrical isolation is provided by direct copper bonded (DCB) ceramic substrates. Heat is transported to the lower heat sink by soldering the chip directly onto the substrate, and to the upper heat sink by spacers which adjust the height of the module.

However, the production of such double-sided cooled modules is pretty expensive and the actual reduction of the thermal resistance is only in the range of 20 to 30%. A reason is that the cooling through the top side of the semiconductor device is less efficient than through the bottom side since the top side is also used for electrical contact. Therefore, the spacer cannot be mounted across the entire top side of the semiconductor device. Care has to be taken while mounting the spacer not to damage the electrical connections on the top side of the semiconductor device.

SUMMARY

It is therefore an object of the present disclosure to provide a semiconductor module, especially a power semiconductor module, having an improved heat dissipation and/or an increased power density.

The foregoing and other objects are achieved by the features of the independent claims. Further embodiments are apparent from the dependent claims, the descriptions and the figures.

According to a first aspect, a semiconductor module is provided, comprising at least two electrically insulating substrates, each having a first main surface and a second main surface opposite to the first main surface. For each of the substrates, at least one semiconductor device is mounted on the first main surface of the corresponding substrate. An external terminal is connected to the first main surface of at least one of the substrates. The substrates are arranged opposite to each other so that their first main surfaces are facing each other.

By this arrangement, it is possible, for example, to efficiently dissipate heat generated by the semiconductor devices from the opposite sides of the module. Further, by the improved heat dissipation and the arrangement of semiconductor devices at opposite sides of the module, the power density of a semiconductor module may be improved. Since the semiconductor devices are only attached single-sided to the substrates, cost and process complexity can be kept low. The modules can be manufactured using well established assembling technologies and therefore are potentially low-cost.

In an embodiment of the first aspect, the semiconductor module further comprises an encapsulation, and the second main surfaces of each of the substrates are exposed on opposite sides of the encapsulation.

Thereby it is possible, for example, to protect the devices by an encapsulation and nevertheless be able to efficiently dissipate heat generated by the semiconductor devices from the opposite sides of the module.

In a further embodiment of the first aspect, the substrates are thermally conductive.

Thereby it is possible, for example, to better conduct heat dissipated from the semiconductor devices to the outside of the module.

In a further embodiment of the first aspect, the at least one semiconductor device is a power semiconductor device.

Thereby it is possible, for example, to apply the disclosure to power modules for which efficiently dissipating heat is of a special importance.

In a further embodiment of the first aspect, a heat sink is mounted to at least one of the second main surfaces of the substrates.

Thereby it is possible, for example, to further increase the efficiency of dissipating heat from the semiconductor devices.

In a further embodiment of the first aspect, the external terminal comprises at least two external leads. All the external leads protrude in a plane from two opposite sides of the module, or all the external leads protrude from a single side of the module, only.

Thereby it is possible, for example, to provide the connections to the module in a plane at two opposite sides, which is a commonly used arrangement for semiconductor devices, or to provide the connections to the module on one side, only, leaving the other sides free for means for dissipating the heat.

In a further embodiment of the first aspect, the external terminal is formed as a lead frame connected to at least two substrates.

Thereby it is possible, for example, to provide a variant of the semiconductor module according to the disclosure.

In a further embodiment of the first aspect, the at least two substrates are electrically interconnected by means of bridges between individual leads of the lead frame.

Thereby it is possible, for example, to easily provide interconnections between the at least two substrates.

In a further embodiment of the first aspect, the external terminal is formed as two separate lead frame s, each connected to one of the at least two substrates.

Thereby it is possible, for example, to provide another variant of the semiconductor module according to the disclosure.

In a further embodiment of the first aspect, the at least two substrates are electrically interconnected by means of individual leads of the two separate lead frame s being connected to each other.

Thereby it is possible, for example, to easily provide interconnections between the at least two substrates.

In a further embodiment of the first aspect, the external terminal is formed as pins connected to one of the at least two substrates and protruding from the module at the side opposite to the substrate to which the pins are connected.

Thereby it is possible, for example, to provide another variant of the semiconductor module according to the disclosure.

In a further embodiment of the first aspect, the at least two substrates are electrically interconnected by means of an internal lead frame or by means of internal pins.

Thereby it is possible, for example, to easily provide interconnections between the at least two substrates.

In a further embodiment of the first aspect, the at least two substrates are arranged spaced apart from each other.

Thereby it is possible, for example, to avoid that the semiconductor devices or other components at the first sides of the substrates contact each other and/or to arrange other components in a space between the substrates.

In a further embodiment of the first aspect, the semiconductor module further comprises a printed circuit board including controllers and/or drivers for the semiconductor devices. The printed circuit board is arranged in the space between the at least two substrates.

Thereby it is possible, for example, to provide an intelligent power module in which controllers and/or drivers of the semiconductor devices are integrated.

The above object is also achieved in accordance with a second aspect.

According to the second aspect, a method of manufacturing a semiconductor module is provided. The method comprises preparing at least two electrically insulating substrates, each having a first main surface and a second main surface opposite to the first main surface, mounting at least one semiconductor device on the first main surface of each of the substrates, connecting an external terminal to the first main surface of at least one of the substrates, and arranging the at least two substrates opposite to each other so that their first main surfaces are facing each other.

With such a method it is possible, for example, to manufacture a semiconductor module in which heat generated by the semiconductor devices can efficiently be removed to both sides of the module. Further, by the improved heat dissipation and the arrangement of semiconductor devices at opposite sides of the module, the power density of a semiconductor module may be improved. Since the semiconductor devices are only attached single-sided to the substrates, cost and process complexity can be kept low. The modules can be manufactured using well established assembling technologies and therefore are potentially low-cost.

In an embodiment of the second aspect, the semiconductor module is further provided with an encapsulation, arranged in a way that the second main surfaces of each of the substrates are exposed on opposite sides of the encapsulation.

Thereby it is possible, for example, to protect the devices by an encapsulation and nevertheless be able to efficiently dissipate heat generated by the semiconductor devices from the opposite sides of the module.

In a further embodiment of the second aspect, thermally conductive substrates are used as the substrates.

Thereby it is possible, for example, to better conduct heat dissipated from the semiconductor devices to the outside of the module.

In a further embodiment of the second aspect, a power semiconductor device is used as the at least one semiconductor device.

Thereby it is possible, for example, to apply the disclosure to power modules for which efficiently dissipating heat is of a special importance.

In a further embodiment of the second aspect, the method further comprises mounting a heat sink to at least one of the second main surfaces of the substrates.

Thereby it is possible, for example, to further increase the efficiency of dissipating heat from the semiconductor devices.

In a further embodiment of the second aspect, the external terminal comprises at least two external leads. All the external leads are arranged to protrude in a plane from two opposite sides of the module, or all the external leads are arranged to protrude from a single side of the module, only.

Thereby it is possible, for example, to provide the connections to the module in a plane at two opposite sides, which is a commonly used arrangement for semiconductor devices, or to provide the connections to the module on one side, only, leaving the other sides free for means for dissipating the heat.

In a further embodiment of the second aspect, a lead frame is connected to at least two substrates as the external terminal.

Thereby it is possible, for example, to provide a variant of the semiconductor module according to the disclosure.

In a further embodiment of the second aspect, bridges between individual leads of the lead frame are provided for interconnecting the at least two substrates.

Thereby it is possible, for example, to easily provide interconnections between the at least two substrates.

In a further embodiment of the second aspect, two separate lead frame s, each connected to one of the at least two substrates are used as the external terminal.

Thereby it is possible, for example, to provide another variant of the semiconductor module according to the disclosure.

In a further embodiment of the second aspect, individual leads of the two separate lead frame s are connected to each other for interconnecting the at least two substrates.

Thereby it is possible, for example, to easily provide interconnections between the at least two substrates.

In a further embodiment of the second aspect, pins connected to one of the at least two substrates and protruding from the module at the side opposite to the substrate to which the pins are connected are used as the external terminal.

Thereby it is possible, for example, to provide another variant of the semiconductor module according to the disclosure.

In a further embodiment of the second aspect, an internal lead frame or internal pins are used for interconnecting the at least two substrates.

Thereby it is possible, for example, to easily provide interconnections between the at least two substrates.

In a further embodiment of the second aspect, the at least two substrates are arranged spaced apart from each other.

Thereby it is possible, for example, to avoid that the semiconductor devices or other components at the first sides of the substrates contact each other and/or to arrange other components in a space between the substrates.

In a further embodiment of the second aspect, the method further comprises arranging a printed circuit board including driver circuits for the semiconductor devices in the space between the at least two substrates.

Thereby it is possible, for example, to provide an intelligent power module in which controllers and drivers of the semiconductor devices are integrated.

It shall further be understood that an embodiment of the disclosure can also be any combination of the dependent claims or above embodiments with the respective independent claims or above aspects.

These and other aspects of the disclosure will be apparent and elucidated with reference to the embodiments described hereinafter.

DETAILED DESCRIPTION

In the following, embodiments of the disclosure are described with reference to the enclosed figures.

Figure 1A:
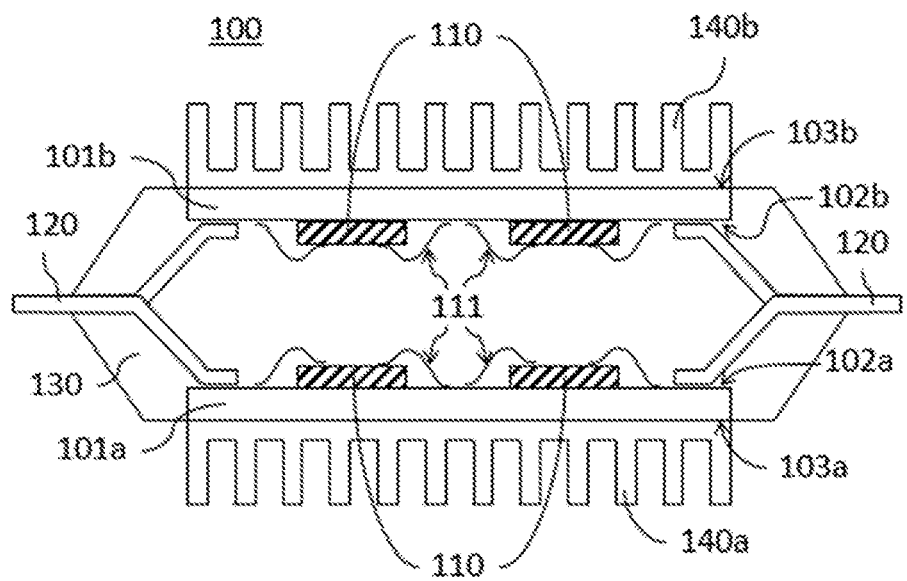
FIG. 1a is a side view of a semiconductor module according to a first embodiment of the present disclosure.
Figure 1B:
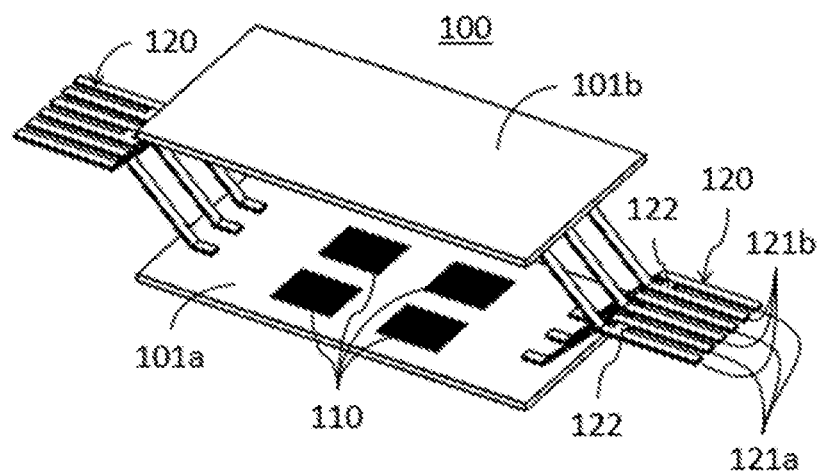
FIG. 1b is a perspective view the semiconductor module according to the first embodiment.

FIGS. 1a and 1b show a semiconductor module 100 according to a first embodiment, FIG. 1a in a side view and FIG. 1b in a perspectival view. For the sake of clarity, an encapsulation and a heat sink are omitted in FIG. 1b.

The semiconductor module 100 comprises two electrically insulating substrates 101a, 101b. Each substrate has two main surfaces opposite to each other. Preferably, the substrates are thermally conductive. The thermal conductivity of the material used may for example be in the range from 25 to 200 W/mK. For example, ceramic may be used as a material for the substrates. As a specific example, DCB substrates may be used in which a sheet of copper is bonded to one or both sides of a ceramic substrate. As another specific example, insulated metal substrates (IMS) may be used which have a metal baseplate, for example made of aluminum, on which an insulating layer, for example a ceramic-filled polymer foil, and a metal foil, for example a copper foil, are stacked in this order.

On a first main surface 102a, 102b of each of the substrates, one or more semiconductor device(s) 110 is or are mounted. Preferably, the semiconductor devices are power semiconductor devices such as, for example, IGBTs, MOSFETs or diodes. For example, the bottom surface of each of the semiconductor devices is die-bonded, for example by soldering or sintering, to a (not shown) wiring layer on the first main surface 102a, 102b of the corresponding substrate 101a, 101b, while (not shown) pads on the top surface of each of the semiconductor devices 110 are bonded to (not shown) pads of the (not shown) wiring layer via bond wires 111 or clips.

According to the embodiments described in the present disclosure, the substrates 101a, 101b are arranged in the semiconductor module 100 opposite to each other so that their first main surfaces 102a, 102b are facing each other. Thereby, a second main surface 103a, 103b of each substrates 101a, 101b, which is opposite to the first main surfaces 102a, 102b, faces towards the outside of the semiconductor module 100. The substrates 101a, 101b are arranged spaced apart from each other so that the semiconductor devices 110 and/or bond wires 111 do not contact each other.

For supplying power and signals from outside, an external terminal is provided. In the present embodiment, the external terminal comprises a lead frame 120. A lead frame is an arrangement of leads within a plane, surrounded by a frame. Even if during manufacturing, the frame is cut away in order to separate the leads, the resulting arrangement of the external ends of the leads in a plane which is caused by their former connection to the planar frame also is generally called "lead frame" in the art. In this meaning, the term is also used in the present application. Only the relevant parts of the lead frame are shown in the figures, not the complete lead frame.

The lead frame has a predetermined number of leads 121. In the present embodiment, some of the leads 121 are bent downwards and some are bent upwards. Downwards and upwards in this context refers to the arrangement shown in FIG. 1a with the first substrate 101a at the bottom and the second substrate 101b at the top of the module.

The leads 121a bent downwards are connected to the first substrate 101a and the leads bent upwards 121b to the second substrate 101b, for example by soldering or sintering. Thereby, each of the substrates 101a, 101b has an electrical connection to the outside. Additionally, the substrates 101a, 101b may also be electrically interconnected to each other by means of bridges 122 that may be provided between adjacent leads 121a, 121b. FIG. 1b shows some leads 121a, 121b being interconnected by a bridge 122 as well as some leads 121a, 121b without a bridge.

The semiconductor module 100 further comprises an encapsulation 130, forming a package for the module. The encapsulation 130 is preferably made of a resin and formed, for example, by transfer molding or injection molding. The encapsulation 130 is formed in a way that the second main surfaces 103a, 103b of each of the substrates 101a, 101b are exposed on opposite sides of the encapsulation. In order to avoid resin from coming into contact with the second main surfaces 103a, 103b, a film-assisted molding method may be used. During the molding, the bridges 122 preferably are over-molded so that they are protected and cannot be seen on the outside of the module.

On the exposed second main surfaces 103a, 103b of the substrates 101a, 101b, a respective heat sink 140a, 140b may be mounted in order to improve the heat dissipation.

Among others, the following effects can be achieved with a semiconductor module as described above: Providing the substrates on opposite sides of the module with their second main surfaces exposed from the encapsulation increases the cooling area of the module. Compared to the prior approaches, such as those referenced in the introductory portion of this description, in which the second dissipating plate is connected via a spacer to the top side of the semiconductor devices on which connection pads are provided, the power dissipation can be improved because the bottom sides of the semiconductor devices are directly and without spacer mounted on each of the substrates. Further, since the semiconductor devices are arranged on both sides of the module, i.e. on each of the substrates, the power density of the module can be increased. Still further, since the power semiconductor devices are only attached single-sided to the substrates, the module can be manufactured using well established assembly technologies, and therefore cost and process complexity can be kept low.

FIG. 2 schematically shows different variants of a semiconductor module 200. The variants differ from each other in the arrangement of the leads of the external terminal.

Figure 2A:
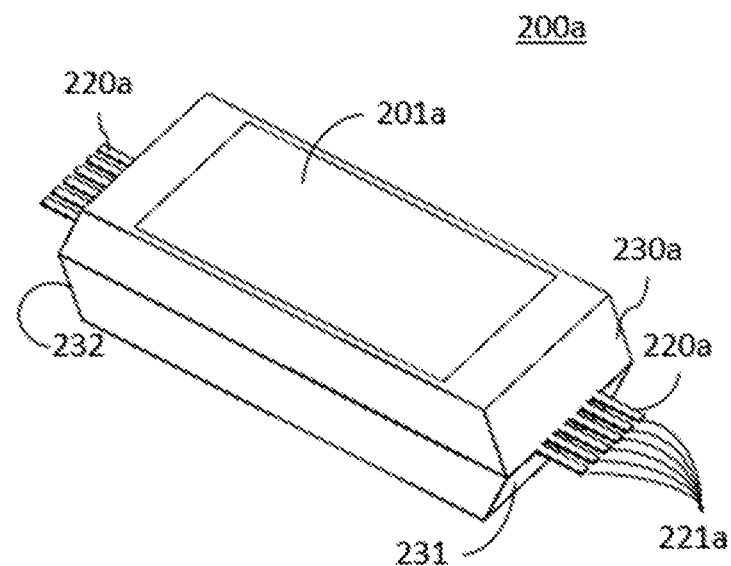
FIG. 2a is a perspective view of a first variant of a semiconductor module according to any of the embodiments of the present disclosure.

The semiconductor module 200a shown in FIG. 2a corresponds to the arrangement shown in FIG. 1. The two substrates 201a are exposed from the encapsulation 230a at the top and bottom of the module 200a (the bottom side is not shown in the figure). The external terminal 220a comprises a predetermined number of leads 221a which protrude in a plane from two opposite lateral sides 231, 232 of the module 200a.

Figure 2B:
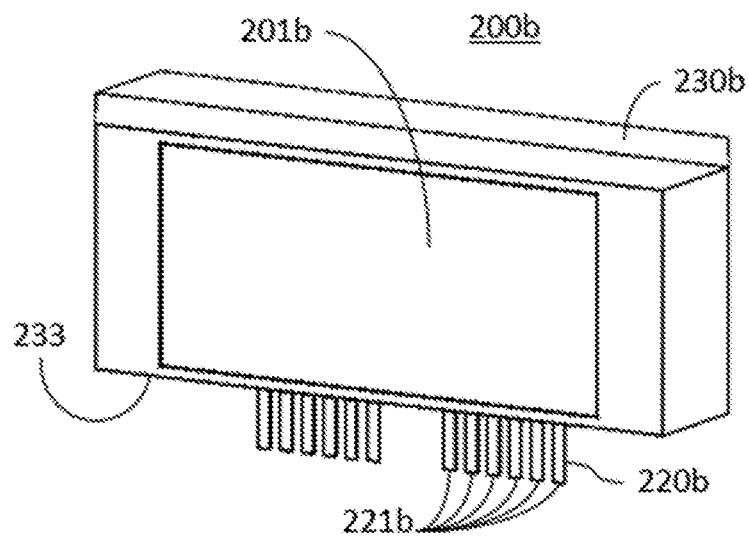
FIG. 2b is a perspective view of a second variant of a semiconductor module according to any of the embodiments of the present disclosure.

The semiconductor module 200b shown in FIG. 2b is a standing or vertical version. The leads 221b of the external terminal 220b all protrude from a single side 233 of the module 200b, only. This module can therefore vertically be inserted into a socket or a circuit board so that the two substrates 201b are exposed from the encapsulation 230b at a front and (not shown) rear side of the module 200b.

Even if a lead frame is described above as a means for electrically connecting the substrates to the outside and/or to each other, the present disclosure is not restricted to this specific example. Any other suitable connecting technology may be used. Some further examples are given in the following embodiments.

Figure 3A:
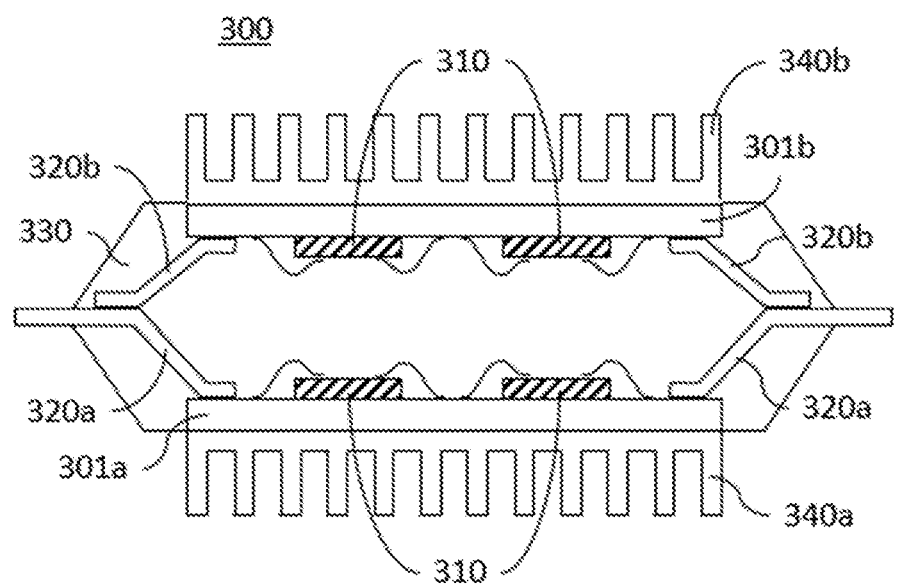
FIG. 3a is a side view of a semiconductor module according to a second embodiment of the present disclosure.
Figure 3B:
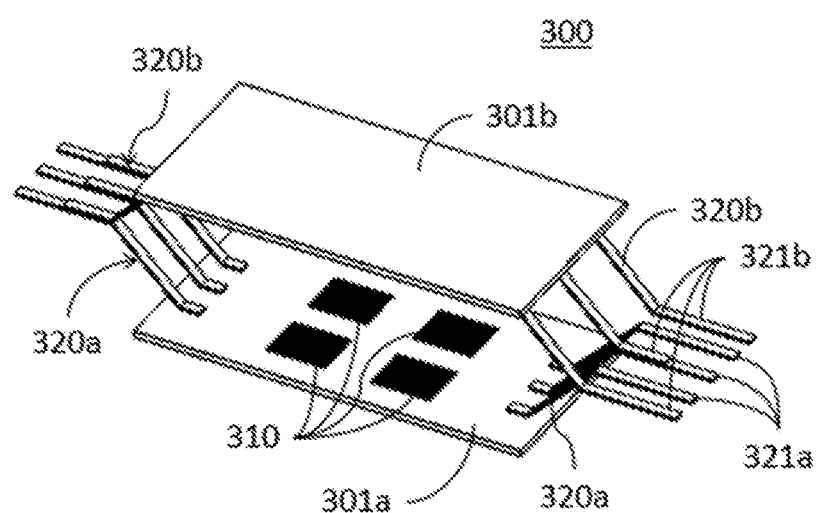
FIG. 3b is a perspective view of the semiconductor module according to the second embodiment.

FIGS. 3a and 3b show a semiconductor module 300 according to a second embodiment, FIG. 3a in a side view and FIG. 3b in a perspective view. For the sake of clarity, an encapsulation and a heat sink are omitted in FIG. 3b.

The semiconductor module 300 differs from the semiconductor module 100 shown in FIG. 1 in the arrangement of the external terminal. Instead of a single lead frame, the external terminal comprises two separate lead frames 320a, 320b, each connected to one of the substrates 301a, 301b. Thereby, each of the substrates 301a, 301b has an electrical connection to the outside. Additionally, the substrates 301a, 301b may also be electrically interconnected to each other by connecting individual leads 321a, 321b of the two separate lead frames 320a, 320b to each other, for example by soldering or sintering. FIG. 3b shows some leads 321a, 321b being connected to each other as well as some leads 321a, 321b not connected to each other.

Other features of the second embodiment than those described above are the same as in the first embodiment. Especially, each of the substrates 301a, 301b has semiconductor devices 310 mounted thereon and is arranged so that the sides bearing the semiconductor devices 310 are facing each other. The other sides of the two substrates are exposed from the encapsulation 330, and a heat sink 340a, 340b may be mounted thereon.

With the semiconductor module 300, the same effects can be achieved as described above for the semiconductor module 100. Further, connecting the individual lead frames to the individual substrates is facilitated because the substrates need not be adjusted to each other during that process.

Figure 4A:
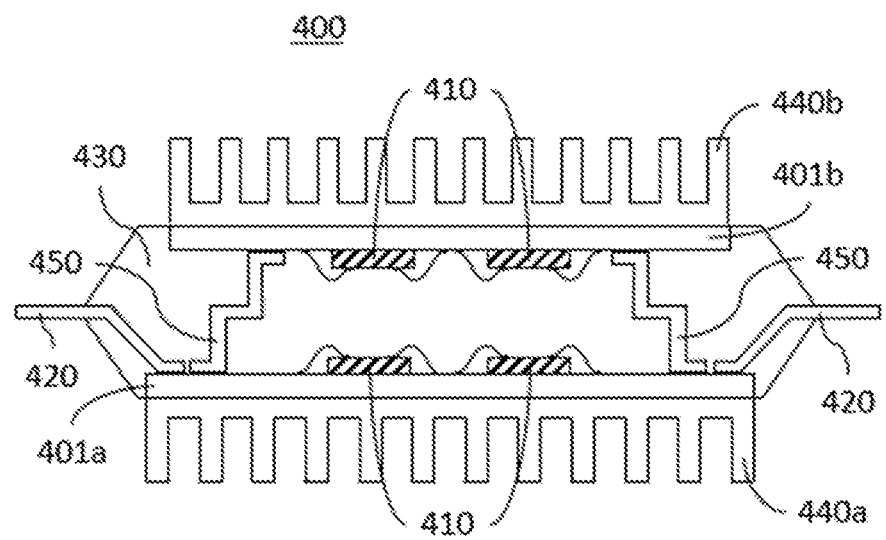
FIG. 4a is a side view of a semiconductor module according to a third embodiment of the present disclosure.
Figure 4B:
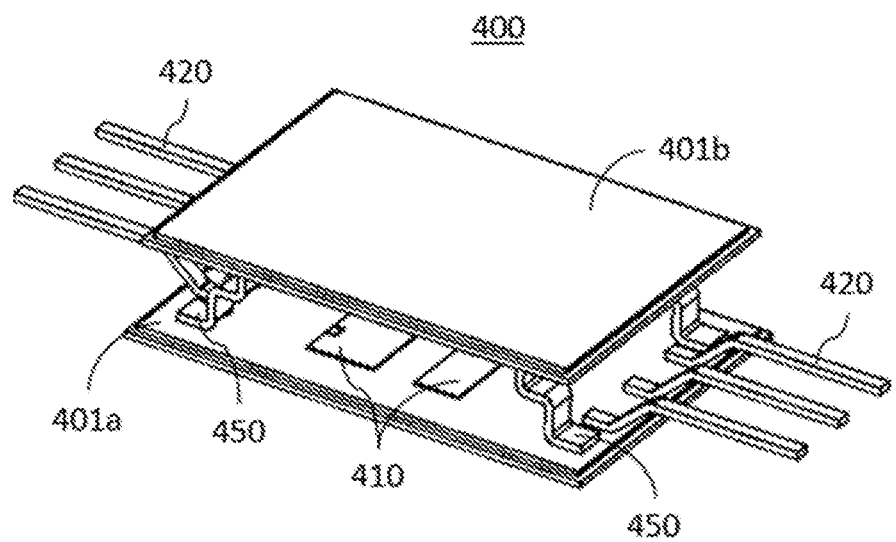
FIG. 4b is a perspective view of the semiconductor module according to the third embodiment.

FIGS. 4a and 4b show a semiconductor module 400 according to a third embodiment, FIG. 4a in a side view and FIG. 4b in a perspective view. For the sake of clarity, an encapsulation and a heat sink are omitted in FIG. 4b.

The semiconductor module 400 differs from the semiconductor module 100 shown in FIG. 1 in the arrangement of the external terminal. Even if the external terminal also comprises a single lead frame 420, it is connected to one of the substrates (first substrate) 401a only. Thereby, this substrate 401a has an electrical connection to the outside. The other substrate (second substrate) 401b is connected to the first substrate 401a and via the first substrate 401a to the outside by an internal lead frame 450.

During manufacturing, the internal lead frame 450 is first connected to one of the substrates, for example the second substrate 401b, by soldering or sintering. Then, the frame is cut away from the lead frame 450, the substrate 401b is flipped, and the lead frame 450 is connected to the other substrate, for example the first substrate 401a, by soldering or sintering.

Other features of the second embodiment than those described above are the same as in the first or second embodiment. Especially, each of the substrates 401a, 401b has semiconductor devices 410 mounted thereon and is arranged so that the sides bearing the semiconductor devices 410 are facing each other. The other sides of the two substrates are exposed from the encapsulation 430, and a heat sink 440a, 440b may be mounted thereon.

The single leads of the lead frame 450 preferably have an elastic property such as a blade spring. During molding, the substrates thereby are elastically pressed against the walls of the mold, thus reducing the risk of mold resin bleeding on the exposed side of the substrates 401a, 401b on which the heat sink 440a, 440b may be mounted.

With the semiconductor module 400, the same effects can be achieved as described above for the semiconductor module 100.

Figure 5A:
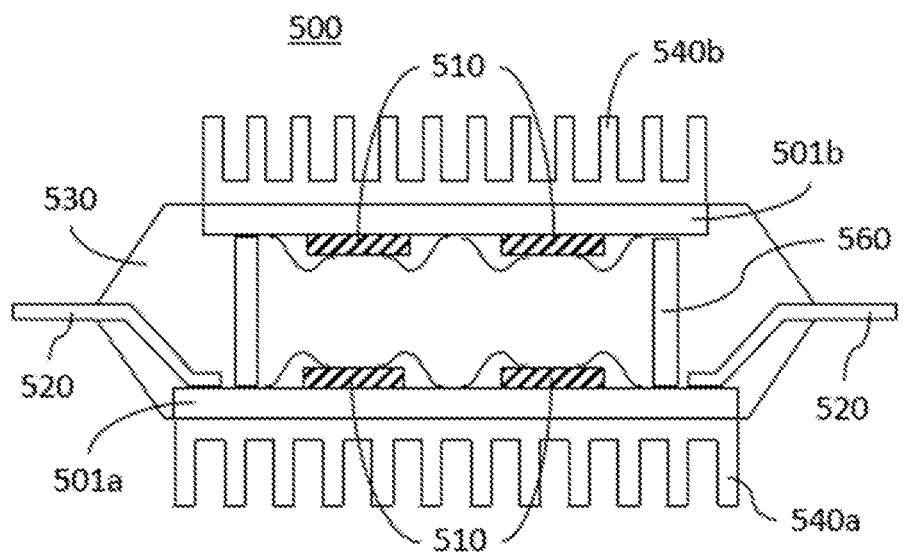
FIG. 5a is a side view of a semiconductor module according to a fourth embodiment of the present disclosure.
Figure 5B:
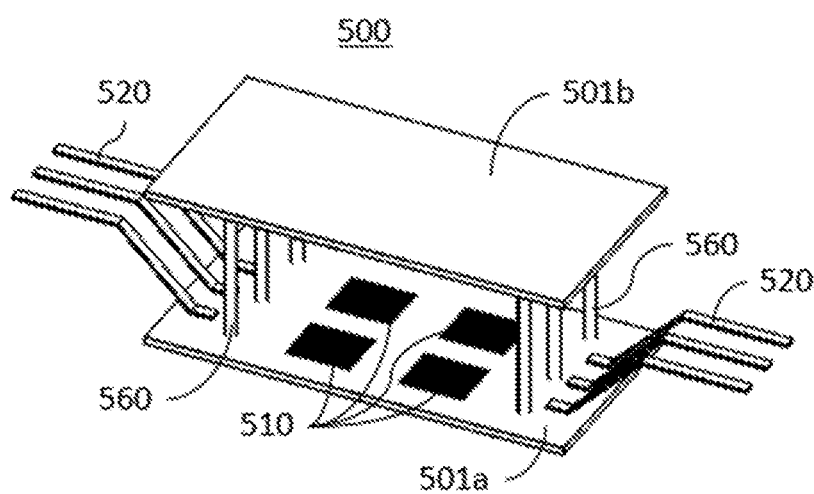
FIG. 5b is a perspective view of the semiconductor module according to the fourth embodiment.

FIGS. 5a and 5b show a semiconductor module 500 according to a fourth embodiment, FIG. 5a in a side view and FIG. 5b in a perspective view. For the sake of clarity, an encapsulation and a heat sink are omitted in FIG. 5b.

Similar to the semiconductor module 400 shown in FIG. 4, the external terminal of the semiconductor module 500 also comprises a single lead frame 520, connected to one of the substrates (first substrate) 501a only. The other substrate (second substrate) 501b is connected to the first substrate 501a and via the first substrate 501a to the outside by means of internal pins 560.

During manufacturing, the internal pins 560 are first connected to one of the substrates, for example the second substrate 501b, by soldering or sintering. Then, the substrate 501b is flipped, and the internal pins 560 are connected to the other substrate, for example the first substrate 501a, by soldering or sintering. Similar to the internal lead frame of the semiconductor module 400, the internal pins 560 may be provided with a spring functionality.

Other features of the fourth embodiment than those described above are the same as in the first to third embodiment. Especially, each of the substrates 501a, 501b has semiconductor devices 510 mounted thereon and is arranged so that the sides bearing the semiconductor devices 510 are facing each other. The other sides of the two substrates are exposed from the encapsulation 530, and a heat sink 540a, 540b may be mounted thereon.

With the semiconductor module 500, the same effects can be achieved as described above for the semiconductor module 100.

In a variant (not shown in the figures), pins may also be used for the external terminal instead of or additionally to the lead frame(s). The pins are then connected to one of the substrates in an area opposite to which the other substrate is not provided, and protrude from the module at the side opposite to the substrate to which they are connected.

Figure 6A:
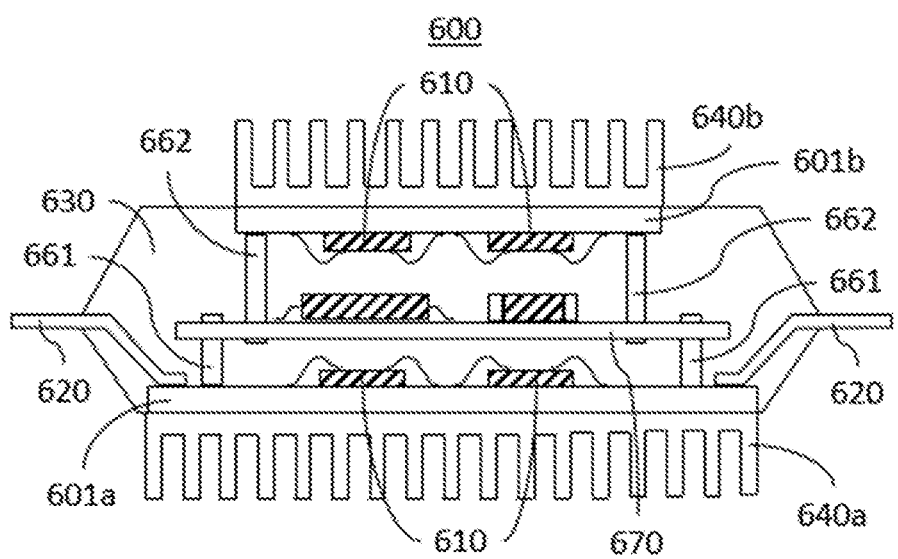
FIG. 6a is a side view of a semiconductor module according to a fifth embodiment of the present disclosure.
Figure 6B:
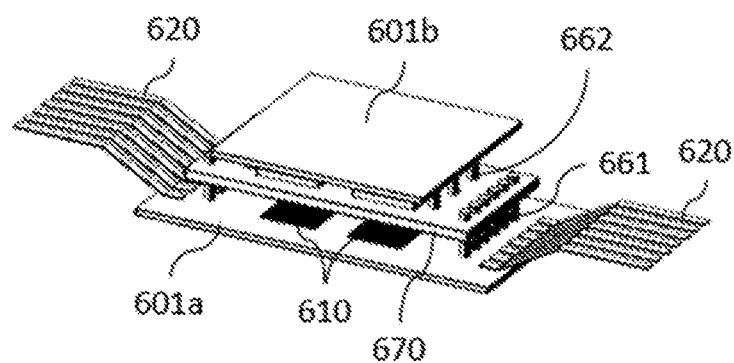
FIG. 6b is a perspective view of the semiconductor module according to the fifth embodiment.

FIGS. 6a and 6b show a semiconductor module 600 according to a fifth embodiment, FIG. 6a in a side view and FIG. 6b in a perspective view. For the sake of clarity, an encapsulation and a heat sink are omitted in FIG. 6b.

Similar to the semiconductor module 500 shown in FIG. 5, the external terminal of the semiconductor module 600 also comprises a single lead frame 620, connected to one of the substrates (first substrate) 601a only. In addition to the two substrates, 601a, 601b, the semiconductor module 600 also comprises a printed circuit board 670 which is arranged in the space between the substrates 601a, 601b. The printed circuit board 670 may for example include controllers and/or drivers for the semiconductor devices 610 as well as other active and/or passive elements.

Similar to in the semiconductor module 500, the first substrate 601a is connected to the printed circuit board 670 by means of internal pins 661, and the second substrate 601b is connected to the printed circuit board 670 by means of internal pins 662. As an alternative, also the two substrates 601a, 601b may be interconnected by means of internal pins at positions where the printed circuit board 670 is not provided or through holes in the printed circuit board 670. Further, the lead frame 620 may also be connected to the printed circuit board 670 instead of being connected to one of the substrates 601a, 601b. Instead of the internal pins, internal lead frames may be used as in the semiconductor module 400.

Other features of the fifth embodiment than those described above are the same as in the first to fourth embodiment. Especially, each of the substrates 601a, 601b has semiconductor devices 610 mounted thereon and is arranged so that the sides bearing the semiconductor devices 610 are facing each other. The other sides of the two substrates are exposed from the encapsulation 630, and a heat sink 640a, 640b may be mounted thereon.

With the semiconductor module 600, the same effects can be achieved as described above for the semiconductor module 100. Further, an intelligent power module can be provided wherein controllers and/or drivers of the semiconductor devices are integrated in the semiconductor module.

The features of the embodiments described above may also be combined, where possible. For example, the different arrangements of the external leads shown in FIGS. 2a and 2b may be applied to any of the above embodiments. As further examples, internal lead frames and/or internal and/or external pins as described with regard to the third and fourth embodiments and/or a printed circuit board as described with regard to the fifth embodiment may also be used in combination with any of the other embodiments.

In summary, the present disclosure relates to a semiconductor module, especially a power semiconductor module, in which the heat dissipation is improved and the power density is increased. The semiconductor module comprises at least two electrically insulating substrates, each having a first main surface and a second main surface opposite to the first main surface. On the first main surface of each of the substrates, at least one semiconductor device is mounted. An external terminal is connected to the first main surface of at least one of the substrates. The substrates are arranged opposite to each other so that their first main surfaces are facing each other.

While the present disclosure has been illustrated and described in detail in the drawings and the foregoing description, such illustration and description are to be considered illustrative or exemplary and not restrictive. The disclosure is not limited to the disclosed embodiments. From reading the present disclosure, other modifications will be apparent to a person skilled in the art. Such modifications may involve other features, which are already known in the art and may be used instead of or in addition to features already described herein.

The disclosure has been described in conjunction with various embodiments herein. However, other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Although the present disclosure has been described with reference to specific features and embodiments thereof, it is evident that various modifications and combinations can be made thereto without departing from the spirit and scope of the disclosure. The specification and drawings are, accordingly, to be regarded simply as an illustration of the disclosure as defined by the appended claims, and are contemplated to cover any and all modifications, variations, combinations or equivalents that fall within the scope of the present disclosure.

What is claimed is:

1. A semiconductor module, comprising:
   at least two electrically insulating substrates, each having a first main surface and a second main surface opposite to the first main surface;
   for each of the substrates, at least one semiconductor device mounted on the first main surface of the corresponding substrate;
   a printed circuit board, the printed circuit board including controllers or drivers for the semiconductor devices, wherein the printed circuit board is arranged in a space between the at least two substrates; and an external terminal connected to the first main surface of at least one of the substrates;

wherein the external terminal is formed as two separate lead frames, each connected to one of the at least two substrates; the at least two substrates are electrically interconnected by individual leads of the two separate lead frames being connected to each other; the substrates are arranged opposite to each other so that respective first main surfaces of the substrates are facing each other.

2. The semiconductor module according to claim 1, further comprising:

an encapsulation, wherein the second main surfaces of each of the substrates are exposed on opposite sides of the encapsulation.

3. The semiconductor module according to claim 1, wherein the substrates are thermally conductive.

4. The semiconductor module according to claim 1, wherein the at least one semiconductor device is a power semiconductor device.

5. The semiconductor module according to claim 1, wherein a heat sink is mounted to at least one of the second main surfaces of the substrates.

6. The semiconductor module according to claim 1, wherein the external terminal comprises at least two external leads, and wherein:

all the external leads protrude in a plane from two opposite sides of the semiconductor module, or all the external leads protrude from a single side of the semiconductor module, only.

7. The semiconductor module according to claim 1, wherein the external terminal is formed as a lead frame connected to at least two substrates.

8. The semiconductor module according to claim 7, wherein the at least two substrates are electrically interconnected by bridges between individual leads of the lead frame.

9. The semiconductor module according to claim 7, wherein the at least two substrates are electrically interconnected by an internal lead frame or by internal pins.

10. The semiconductor module according to claim 1, wherein the external terminal is formed as pins connected to one of the at least two substrates and protruding from the semiconductor module at the side opposite to the substrate to which the pins are connected.

11. The semiconductor module according to claim 1, wherein the at least two substrates are arranged spaced apart from each other.

12. A method of manufacturing a semiconductor module, comprising:

preparing at least two electrically insulating substrates, each having a first main surface and a second main surface opposite to the first main surface;

mounting at least one semiconductor device on the first main surface of each of the substrates;

connecting an external terminal to the first main surface of at least one of the substrates, wherein the external terminal is formed as two separate lead frames, each connected to one of the at least two substrates, the at least two substrates are electrically interconnected by individual leads of the two separate lead frames being connected to each other;

arranging the substrates opposite to each other so that respective first main surfaces of the substrates are facing each other; and arranging a printed circuit board in a space between the at least two substrates, wherein the printed circuit board includes controllers or drivers for the semiconductor devices.

* * * * *